(12) United States Patent
Sudjian et al.

(10) Patent No.: US 7,521,976 B1
(45) Date of Patent: Apr. 21, 2009

(54) LOW POWER HIGH SPEED LATCH FOR A PRESCALER DIVIDER

(75) Inventors: Douglas Sudjian, Santa Clara, CA (US); David H. Shen, San Jose, CA (US)

(73) Assignee: NanoAmp Solutions, Inc., Santa Clara, CA (US)

( * ) Notice: Subject to any disclaimer, the term of this patent is extended or adjusted under 35 U.S.C. 154(b) by 264 days.

(21) Appl. No.: 11/296,549

(22) Filed: Dec. 7, 2005

Related U.S. Application Data

(60) Provisional application No. 60/634,634, filed on Dec. 8, 2004.

(51) Int. Cl.
*H03K 3/00* (2006.01)

(52) U.S. Cl. .................................. 327/199; 327/201

(58) Field of Classification Search .............. 331/1 A, 331/16, 25; 327/185, 199, 200, 201, 208, 327/210–212, 223
See application file for complete search history.

(56) References Cited

U.S. PATENT DOCUMENTS 6,788,103 B1 * 9/2004 Feldman et al. ............... 326/34

OTHER PUBLICATIONS

Cicero Vaucher, et al.,"A Family of Low-power Truly Modular Programmable Dividers in Standarad 0.35-um CMOS Technology,"IEEE JSSC, vol. 35, No. 7, Jul. 2000, pp. 1039-1045.
Yuichi Kado, et al, "A 1-GHz/0.9mW CMOS/SIMOX Divide-by-128/129 Dual-Modulus Prescaler Using a Divide-by-2/3 Synchronous Counter", IEEE JSSC, vol. 28, No. 4, Apr. 1993, pp. 513-517.
Turgut S. Aytur, et al, "A 2-GHz, 6-mW BiCMOS Frequency Synthesizer", IEEE Journal of Solid State Circuits, vol. 30, No. 12, Dec. 1995, pp. 1457-1462.
Behzad Razavi, et al, "Design of High speed, Low Power Frequency Dividers and Phase-Locked Loops in Deep Submicron CMOS", IEEE JSSC, vol. 30, No. 2, Feb. 1995, pp. 101-109
Juren Yuan, et al, "New Single-Clock CMOS latches and Floipflops with Improved Speed and power Savings", IEEE JSSC, vol. 32, No. 1, Jan. 1997, pp. 62-67.

* cited by examiner

*Primary Examiner*—David Mis
(74) *Attorney, Agent, or Firm*—Fish & Richardson P.C.

(57) ABSTRACT

A high-speed latch is disclosed that can function at high-speed input clocking frequencies. The active loads used within the latch design exhibit an input impedance that is inductive to the rest of the circuit to improve the driving capability of the overall latch in the presence of loading capacitances. The latch circuit, when used in a system or stand alone divider, will consume very low power while reducing the silicon die area. Possible applications include but are not limited to frequency dividing and counting applications. Of particular interest is the use of this high-speed latch in a prescaler divider as a part of a charge pump phase-locked loop design for single chip CMOS multi-band and multi-standard radio frequency transceiver integrated circuits.

31 Claims, 18 Drawing Sheets

Prior Art

200

Prior Art

Prior Art

Prior Art

LOW POWER HIGH SPEED LATCH FOR A PRESCALER DIVIDER

CROSS-REFERENCE TO RELATED APPLICATIONS

This application claims priority to U.S. Provisional Application Ser. No. 60/634,634, filed on Dec. 8, 2004.

TECHNICAL FIELD

The present disclosure relates to a low power CMOS latch that functions in a dual modulus prescaler as a high frequency divider that can be used in phase-locked loop (PLL) frequency synthesizers. The PLL application examples include but are not limited to radio frequency receivers and transmitters for all wireless communication standards including cellular 2G/2.5G/3G/4G and future generation wireless communications, optical fiber communications, network communications and storage systems.

BACKGROUND

The growing demand for wireless communications has motivated attempts to design radios that permit the integration of more components onto a single chip. The recent advances in CMOS semiconductor processing allow the integration of the radio receiver and transmitter into a single chip radio frequency (RF) transceiver to reduce cost, size and power consumption.

Phase-Locked Loop and Frequency Dividers

The Phase-locked loop (PLL) frequency synthesizer, one of the most important and challenging building blocks of the RF transceiver, is most suitable for the monolithic integration of wireless communication integrated circuits. The preferred application of the disclosed circuits is in the low cost integration of wireless communication integrated circuits using CMOS process technologies. However, the disclosed circuits can be implemented by one skilled in the state of the art using other process technologies such as bipolar, bipolar/CMOS (e.g. SiGe, Silicon Germanium), Gallium Arsenide (GaAs) and Silicon-on-Insulator (SOI). PLLs' are used in but are not limited to wireless receivers and transmitters in part for frequency synthesis where a synthesized local oscillator (LO) frequency is needed to mix down the Receive Signal Carrier such that the modulated signal is down-converted and the resulting base-band signal can be processed. In wireless operation, the receive signal can operate in different bands or at discrete frequencies as part of the data transmission standard, an agile PLL frequency synthesizer is needed in order to track the receiver frequency by adjusting the LO frequency.

PLL frequency synthesizers perform frequency synthesis by changing a voltage-controlled oscillator (VCO) output clock signal's frequency in a precisely controlled manner using various methods. The output clock signal frequency can be controlled using a PLL as a control system. A charge pump PLL is comprised of a reference oscillator (usually crystal based), a phase-frequency detector (PFD), charge pump (operating in either voltage or current mode), a loop filter, a voltage-controlled oscillator (VCO), and a programmable feedback frequency divider. The programmable frequency divider can be composed of many design variations. Typically, high performance feedback divider designs use a front-end prescaler and a back-end programmable divider. The front-end prescaler is designed to operate at high speeds and the back-end programmable divider operates at lower speeds while extending the counting range over a wide range of values. Both dividers can interface together in different configurations so that the proper division value is achieved. FIG. 1 shows a block diagram 100 of a frequency synthesizer design. In this design the front-end prescaler 110 divides down the high VCO frequency, Fvco, to an intermediate frequency, FH. This lower frequency is then used to clock the next divider chain (M divider 120) that can be programmed to different values to increase the total division value.

The PLL is typically able to synthesize frequencies with frequency steps equal to an integer multiple of the input reference frequencies. Typically, the PLL output clock signal is multiplied up in frequency from an input reference clock using a clock divider in the PLL feedback clock path. Clock multiplication is achieved when the controllable VCO clock signal is divided down and compared to the frequency reference input signal so that both signals have the exact frequency and proper phase alignment. Since the divided-down VCO signal is scaled down in frequency to match an input reference signal, the input reference frequency is said to be "multiplied up" to equal the VCO frequency. To adjust or tune the VCO output to another frequency, the feedback divider division modulus is changed. In many integer-M/N PLL applications, the feedback divider is capable of dividing by a fixed integer due to the fact that channel spacing is defined based upon the input reference frequency. Thus for an integer-M/N PLL synthesizer, clock multiplication and synthesis is achieved by changing the output clock frequency by an integer amount relative to the reference frequency input. Since the output clock signal of the VCO is equal to the integer (M/N) times the reference frequency, an integer adjustment to M (e.g. M+1) changes the output frequency by the same integer difference from the reference frequency (i.e. $\Delta f=(M+1-M)*fref/N=fref/N$). Thus, the channel spacing frequency is fixed and equal to the reference frequency divided by N. Fractional-N PLL synthesizers divide the VCO signal by a fractional amount using an integer feedback divider. Fractional division is achieved by dynamically modulating the division value so that the effective count length is of fractional length when averaged over an integer number of cycles of the input reference frequency. Fractional-N PLLs permit finer resolution of the output frequency changes which is very important when smaller channel spacing increments are required in a communication receiver with constrained input reference frequency. Sigma-Delta Modulation (SDM) PLLs are another example of combining modulation techniques to feedback counter divisions in a PLL control system to provide frequency synthesis and noise shaping improvements to the VCO output clock signal. There are many different PLL synthesizer design implementations that can be achieved using Integer-M/N, Fractional-N, Sigma-delta modulation, and hybrid combinations of all three. Thus, frequency synthesis can be achieved digitally by adjusting the counter division ratio in the PLL feedback loop. Due to the emphasis placed upon channel spacing, frequency acquisition, and phase noise in a PLL frequency synthesizer, the proper feedback divider implementation is crucial in achieving many PLL design parameters.

The fact that the VCO clock needs to be divided down to a lower frequency presents problems and trade-offs in the synthesizer design. Typically, to limit the power consumption in the overall PLL divider, a first stage divider, referred to as "prescaler" is used to initially divide the high frequency VCO clock signal down to an intermediate frequency level. Then use of a following second stage programmable circuit is clocked and divides at a secondary lower clocking speed. The reason for using two or more dividers is to relax the bandwidth and power requirements of the second feedback divider for large division modulus. Thus, only a small portion of the total divider circuitry needs to operate at high switching speeds. Note that for a given switching speed, the power consumption required is proportional to a given relationship. For CMOS circuitry that operates using the full-swing variation of its own power supply, the power required is proportional to the power supply voltage-squared (square law relationship). The majority of the power required for division is typically consumed in the front-end prescaler divider of the PLL frequency synthesizer. The prescaler can have either fixed or variable moduli for division. The choice of division values and programmability is part of the overall PLL synthesizer design and depends on the required frequency synthesis resolution in a particular application.

Prescalers are designed in various process technologies for different applications. A typical prescaler functioning as a high frequency divider in a large divider chain may be composed simply of a front-end fully differential divide-by-two functional block, a current-mode logic (CML) divider block and a CML-to-CMOS converter. In this typical application, all clocking signal amplitudes will be a combination of either fully differential analog or full-swing CMOS digital levels. The divider input signal from the VCO can be AC-coupled and then divided by two. Most of the power is consumed in the divide-by-two and CML divider blocks.

Due to the high frequencies involved, a technique called Shunt-Peaked amplification will be proposed in this disclosure for enhancing amplifier bandwidths. Optimized on-chip spiral inductors or transistors whose active port appears inductive can be used as the shunt-peaking elements. The attractive feature of this technique is that the bandwidth improvement requires no additional power and can in fact lower power dissipation depending on the process technology. When Shunt-Peaked amplification is designed into a CML type latch, the bandwidth extension and power dissipation benefits apply as they would in a more straight forward amplifier design. Due to the nature of the active inductive component tending to tune out the loading capacitance, a faster latch or combination flip-flop is achieved. This speed improvement is based upon decreased times needed for the setup and hold requirements. Based upon a more efficient latch structure, the geometries of the internal switching transistors in the latch can be scaled down based upon the reduction of required switching current for a given bandwidth. In addition, internal capacitive is reduced in the circuit due to active transistor well geometry reduction such that the individual dividers are operating faster by driving less parasitic loading capacitance.

Prescaler Designs

Prescalers used for clock division are used in PLL frequency synthesizers in many computer, consumer and communication applications. Prescalers can be designed to operate in CMOS, Bipolar-CMOS (Bi-CMOS), Gallium Arsenide (GaAs), Bipolar and other process technologies. Prescalers used as frequency dividers operate in voltage mode and are implemented in different ways with fully differential or single-ended signal designs. Within these two classifications, there are multiple design options with their own inherent benefits and flaws. The simplest prescaler design is the single-ended signal design where the division ratio is fixed and not programmable. A flip-flop circuit composed of two latch circuits, one master and one slave, can be used to reduce an input signal frequency by half and thereby accomplish a divide-by-two division function. Divide-by-two is defined to mean that one output clock period is produced for every two input clock periods. More complicated architectures permit variable division or counting by using digital control signals to change an input clock signal's different dividing paths. For example, one divide-path may require two input clock pulses to generate one output clock signal (e.g., divide-by-two). Digitally changing this clock division path may permit the divide-by-two circuit to ignore or "pulse swallow" an additional clock pulse such that three input clock pulses are needed to generate one output clock signal (e.g., divide-by-three).

High Frequency Dividers Used in Prescalers

Frequency division is typically done with master-slave flip-flops configured as a cascade connection of two latches in series. The maximum frequency allowable is limited by the time constants in the circuit consisting of gate delays (Td), capacitances and resistances in the circuit. Different frequency dividers have been proposed to improve the prescaler performance relating to PLL applications in frequency synthesizers.

FIG. 2 shows a widely used divide-by-two circuit 200 that consists of two latches in a master-slave configuration. This configuration is limited in function to just scaling down the input frequency and depending on the particular process technology, can only be used for relatively low input clock frequencies. Note, when using such a simple feedback divider in a PLL application, the frequency division resolution will be limited therefore the synthesizer channel spacing will be coarse.

FIG. 3 shows a similar divide-by-two circuit 300 where the input and output clocks are fully differential. The circuit block consists of a clock input stage 310 with level-shift, a master-slave D flip-flop (two latches 320, 330) and two output buffers 340, 350. This divider design is useful for generating differential outputs that differ by 90 degrees (quadrature). VCO_I leads VCO_Q by 90 degrees. This differential design configuration can have a higher bandwidth than the divider shown in FIG. 2 because the internal node voltage swings are lower in amplitude permitting internal voltage states to switch in a shorter time.

More complicated prescaler designs have been published and used in situations whereby the division rate or division modulus has to be controlled in real-time applications such as high performance PLL designs. FIG. 4 shows a dual-modulus prescaler circuit design 400. This architecture is a conventional divide-by-64/65 dual-modulus prescaler. The circuit block consists of two separate dividers, the top section divides by 4 or 5 and the bottom section divides by sixteen. By changing the polarity of the modulus control input 410, the top feedback ring of 3 D-type flip-flops (dff) 415, 420, 425 will change the internal divide-by modulus of the Fin clock from 4 to 5 by pulse-swallowing one more period of the input clock. With both dividers working together, this circuit constitutes a conventional divide-by 64/65 dual-modulus prescaler.

FIG. 5 depicts another type of full-swing D-type flip-flop 500 that can be used in a frequency divider application. This flip-flop 500 is called a true single phase clock (TSPC) dynamic flip-flop. The dynamic core of the flip-flop 500 contains multiple transistors directly clocked at their inputs. Additionally, there are 3 transistors (M1 505, M3 515 and M5 525) with input data on their gates, 2 transistor gates (M7, M9) connected to a pre-charged node, A, and 1 pre-charged node, B, with 3 transistors (M2, M3 and M5). Pre-charging of internal nodes based upon the state of the input clock leads to faster clocking and transferring of the input data. Due to the full swing voltage node switching, there would still be a maximum bandwidth limitation using this circuit as core cells in a design similar to FIG. 4.

FIG. 6, FIG. 7, and FIG. 8 show fully differential sample-hold CML latches 600, 700, 800 where the load elements are either passive resistive, active or passive inductive.

FIG. 6 details a fully differential sample-hold CML latch 600 where the input data is sampled or latched (held) dependent on the state of the input clock. Two such circuits of this type can be used in series with local feedback to achieve a master-slave flip-flop divider circuit while FIG. 3 is an example of two differential CML latches used as a frequency divider. The load elements 610, 615 in FIG. 6 are shown to be resistive. For a monolithic circuit, conventional circuit techniques can be used to design the bias current reference-I 620 depicted in FIG. 6, such that it will vary inversely proportional to the resistor variation. For example, using a Poly resistor requires bias current inversely proportional to the Poly resistor variation. This will limit the voltage swing across the resistor to a constant value over process variations. As a result, additional series circuits can reliably operate based upon the latch output voltages. Other load elements as part of a latch can be used such as an active PMOS transistor biased in the triode region, passive inductor and an active inductor.

FIG. 7 shows a design similar to FIG. 6 where the load elements are active PMOS transistor loads 720, 725 with the transistor gates biased from a separate replica bias circuit 710. The replica bias circuit 710 is used outside of the actual latch/flip-flop design to bias the gates of the active loads inside the latch circuit. The proper bias voltage developed in the replica bias circuit and applied to the gates of the active PMOS loads keeps the PMOS transistors in the triode region of operation to make reliable voltage swings. Parasitic capacitance is higher in this design than using pure resistive loading.

FIG. 8 shows a latch 800 or similar bi-stable circuit requiring a passive inductive load 810 used in critical noise applications. This approach will implement a shunt-peaked loading approach as discussed earlier. However depending on the process technology and frequencies involved, it may not be practical to get a tight, compact multiple cell layout with relatively big spiral inductor load elements due to the monolithic die area being too large.

FIG. 9 shows a circuit 900 of two DSTC, (Dynamic-Single-Transistor Clocked)n-latches that are used to construct a master-slave D-flip-flop. The cross-coupled PMOS transistor pairs M3 910, M4 915 in each latch pair form a positive feedback loop that will hold the value of the latch at their common drain nodes after leaving the sample mode and entering the hold mode of operation. The loop gain of the cross-coupled PMOS load, as a part of the latch in the hold mode, must be greater than unity for latching action to be reliable. The overall latch design does reduce circuit complexity due to the fact that only one clock transistor, namely M5 925 in each latch, is required to implement a flip-flop. However, because the output voltage of this latch is being developed across the gate-to-source of the PMOS transistors M3 910, M4 915, a larger output voltage swing will be necessary. The only way to control and lower this voltage level swing is to make the crossed-coupled PMOS transistor widths larger and thus add loading capacitance to the circuit. In addition, the full-swing output voltage signals used for clocking feedback may not be necessary to fully switch the input NMOS differential pairs, M1 930 and M2 935 of the latch circuit. The circuit of FIG. 6 is preferred for higher bandwidth designs.

In FIG. 10, another circuit option for frequency division is shown. This divider circuit 1000 is similar in structure to a static frequency dual latch design in a divide-by-two configuration. This design contains two identical stages as does a typical dual latch D-type master-slave flip flop. The difference here is that the internal second stage cross-coupled latch transistors are not needed. The internal second stage (negative trans-conductance) adds capacitance and is not necessary at high frequencies. This design of this circuit operates like a four-stage ring oscillator. This circuit 1000 relies on internal nodal capacitance for memory storage (latching) and is used for very high frequencies. In fact, the frequency range for this circuit can be limited due to this reason.

The described techniques can provide an improved prescaler design for high performance Frequency Synthesizers. The application is intended for the very stringent design specifications of high integration RF receivers and/or transmitters requiring low cost, small size and low power. Though the application of the described techniques is intended for CMOS circuits, they can be applied to other technologies using BICMOS and Bipolar processes. In a common PLL architecture of a prescaler and a lower frequency divider driven by a VCO, the majority of the power consumption in the feedback divider is used in the prescaler in dividing the highest VCO frequency. This translates directly to the AC performance of the overall PLL control loop system.

The following lists some advantages that may be obtained with respect to previous prescaler dividers.

1. Higher input frequency clock signals can be divided using lower power compared to the prior art prescaler divider designs and other types of divider designs.
2. The amplifier gain in the dividers is a ratio of transistor transconductances and track over temperature and manufacturing process variations.
3. Shunt peaked active inductive loads tune out a given circuits loading capacitance to achieve a higher bandwidth latch and overall divider capable of being clocked at higher frequencies.
4. Active monolithic area is far less than with spiral inductors to achieve a shunt-peaked effect.
5. The operating frequency range is not limited compared to other high speed designs which use internal nodal capacitance for latching.

Described below is a prescaler that functions as a high speed frequency divider in a frequency synthesizer. The following lists some design features of the prescaler described below.

1. A fully differential latch using shunt peaked active loads with inductive behavior to partially tune out the loading capacitance to achieve a higher circuit bandwidth for a given power consumption.
2. The gain of the latch circuit is a ratio of transistor transconductances that enable the gain to be relatively constant over process and operating conditions.
3. Higher operating frequency for a given power consumption.
4. Reduced die size of the overall prescaler design due to the lower bias currents required.

DESCRIPTION OF THE PREFERRED EMBODIMENT

Figure 1:
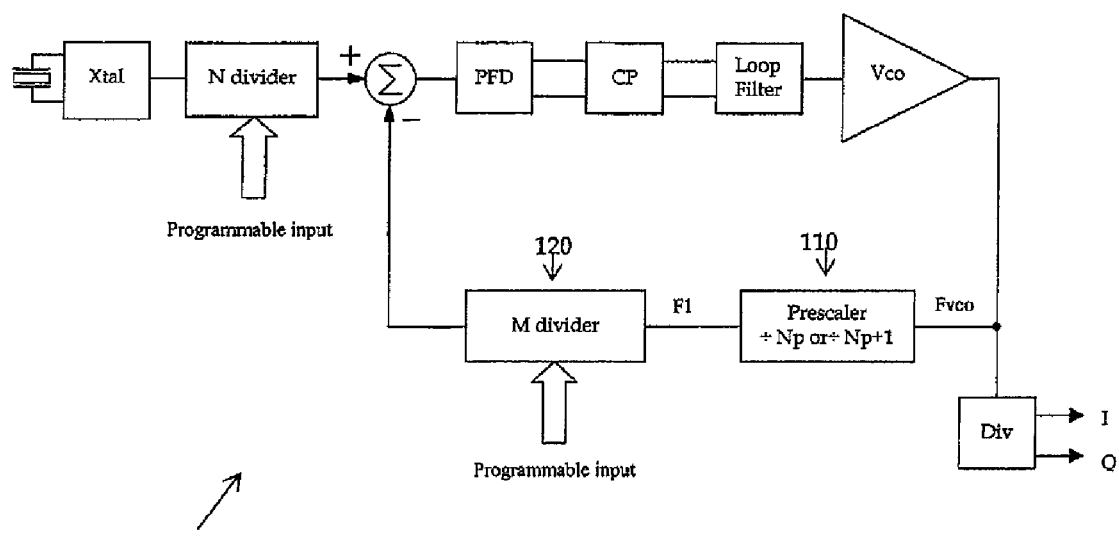
FIG. 1 is a schematic of a PLL synthesizer with a feedback divider chain with a prescaler and secondary M divider to control the VCO output frequency and channel spacing.
Figure 2:
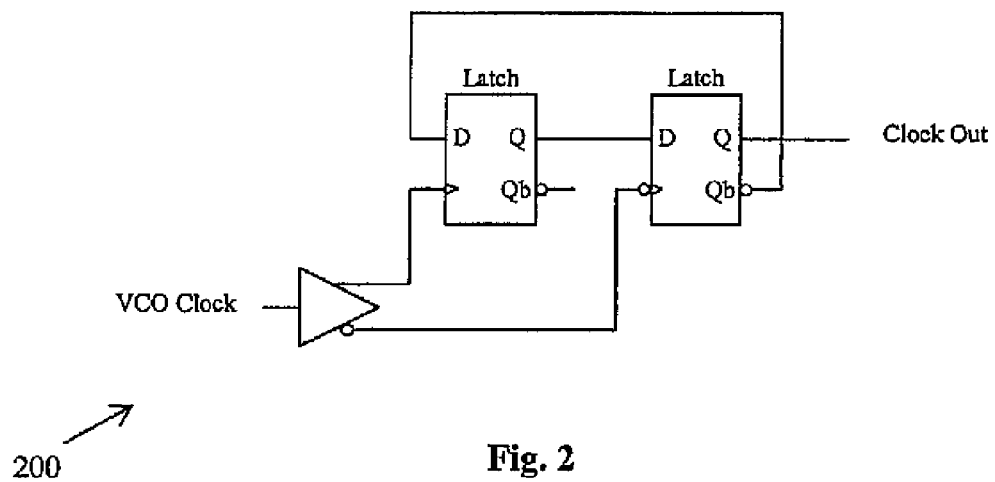
FIG. 2 is a schematic of an example two latch master-slave flip-flop circuit that divides an input clock frequency by two.
Figure 3:
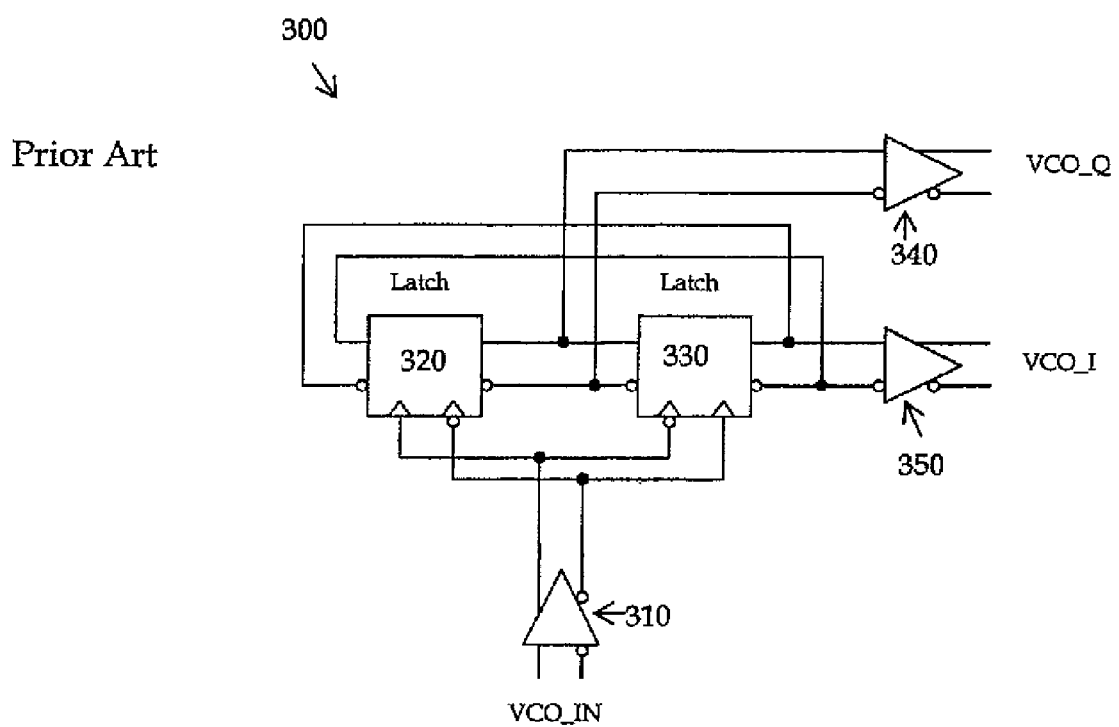
FIG. 3 is a schematic of an example fully differential circuit using two latches that divide an input clock frequency by two.
Figure 4:
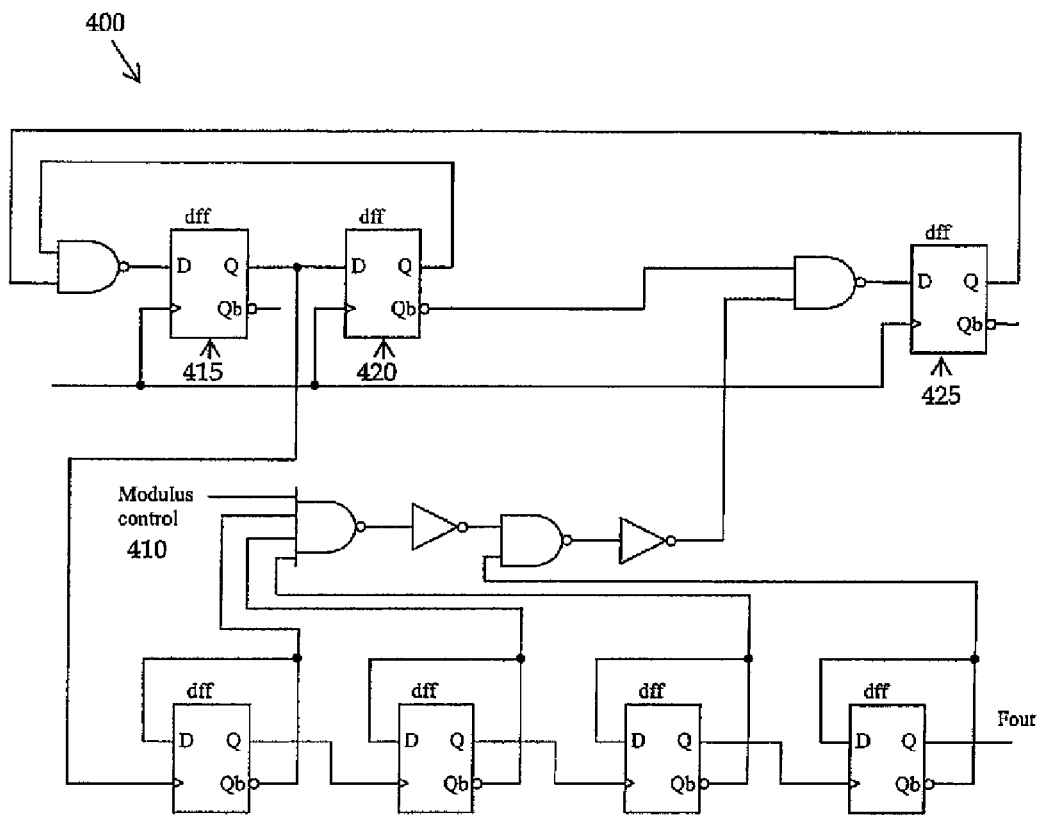
FIG. 4 is a schematic of an example dual modulus prescaler divider that divides an input clock frequency by 64 or 65.
Figure 5:
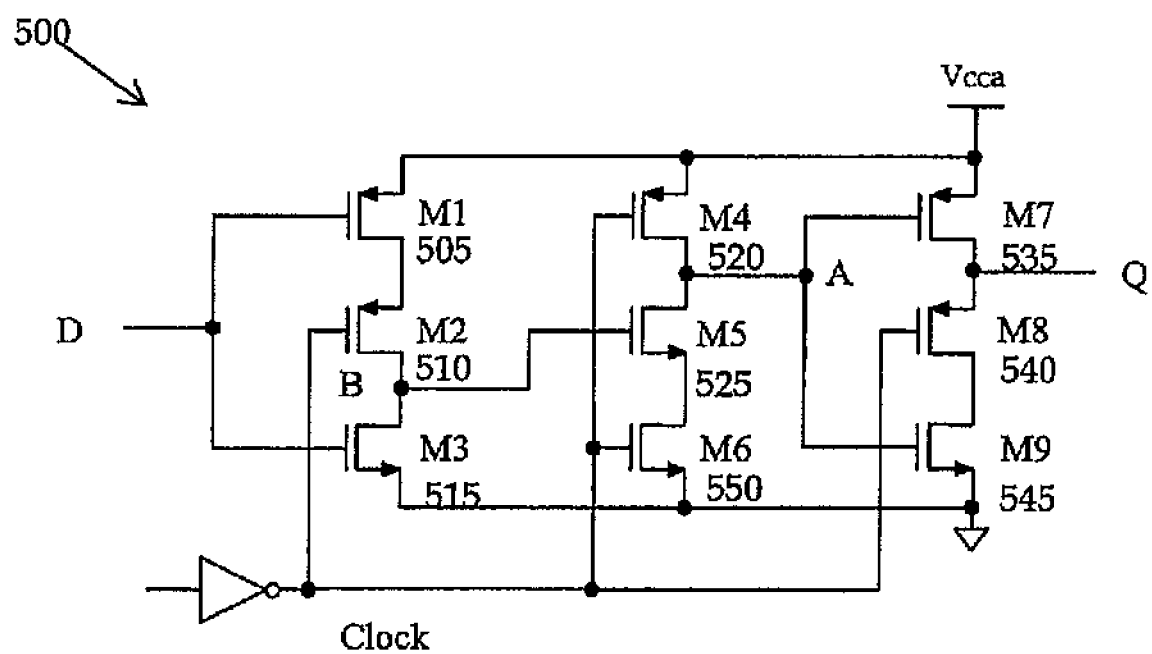
FIG. 5 is a schematic of an example single phase clock (TSPC) dynamic D-type flip-flop.
Figure 6:
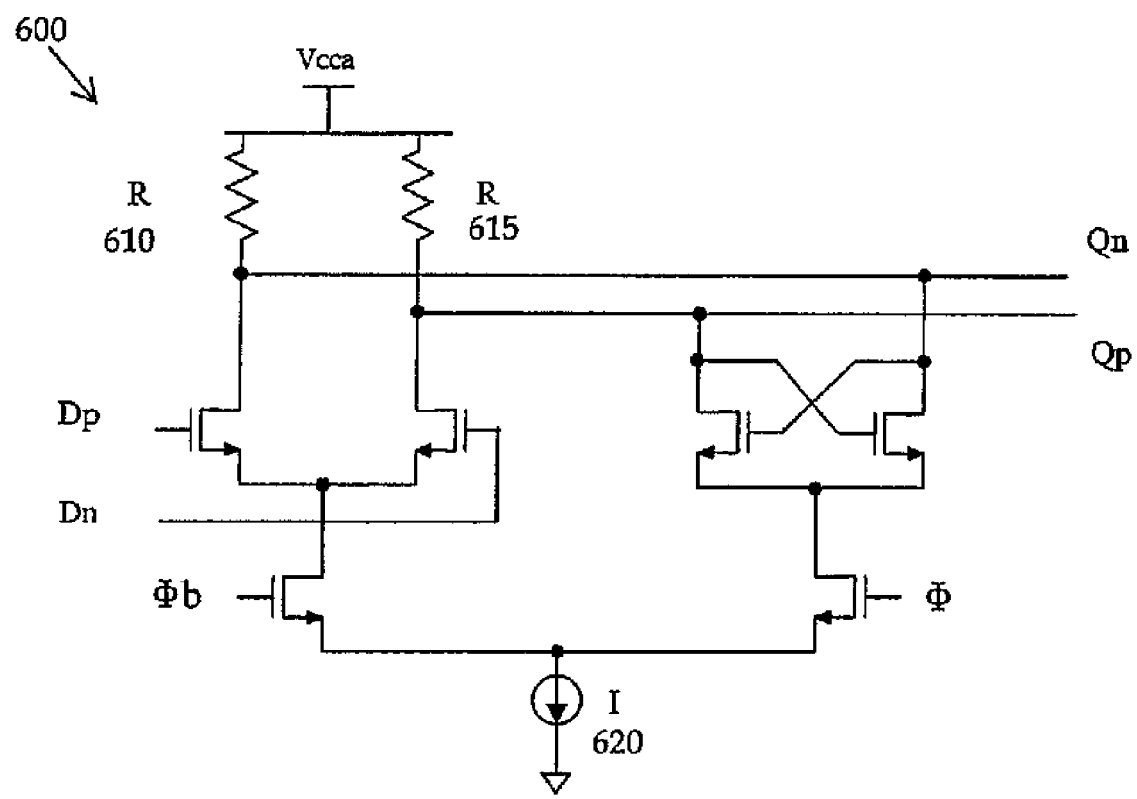
FIG. 6 is an schematic of an example fully differential sample-hold CML latch using resistive loads where the input data is sampled or latched dependent on the state of the input clock.
Figure 7:
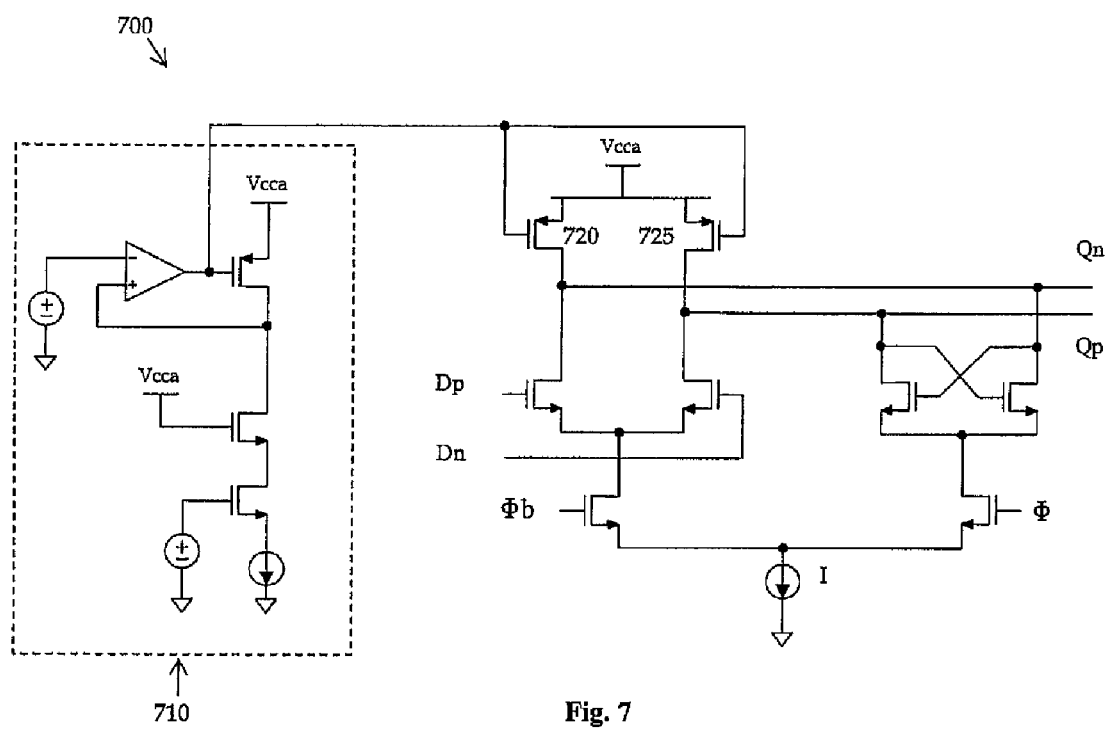
FIG. 7 is a schematic showing an example replica bias arrangement to use a PMOS transistor load as an active load in a sample-hold latch design.
Figure 8:
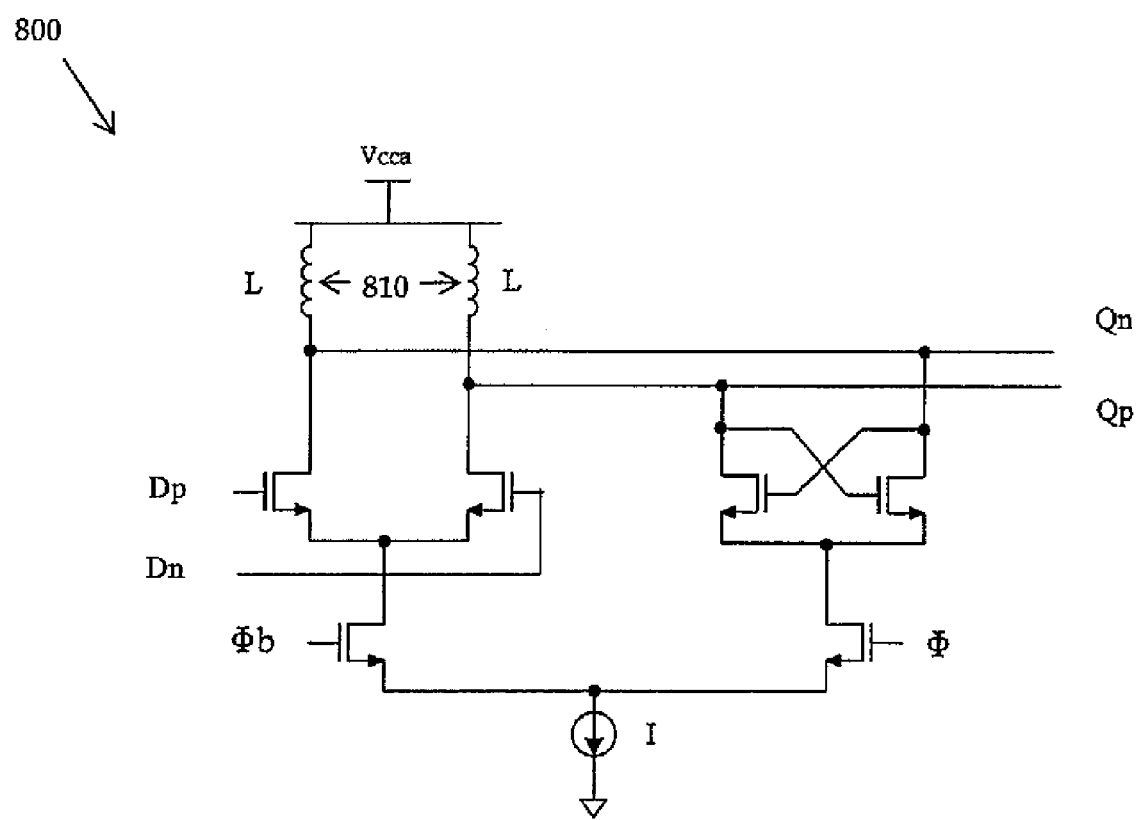
FIG. 8 is a schematic of an example fully differential sample-hold latch using a passive inductor load where the input data is sampled or latched dependent on the state of the input clock.
Figure 9:
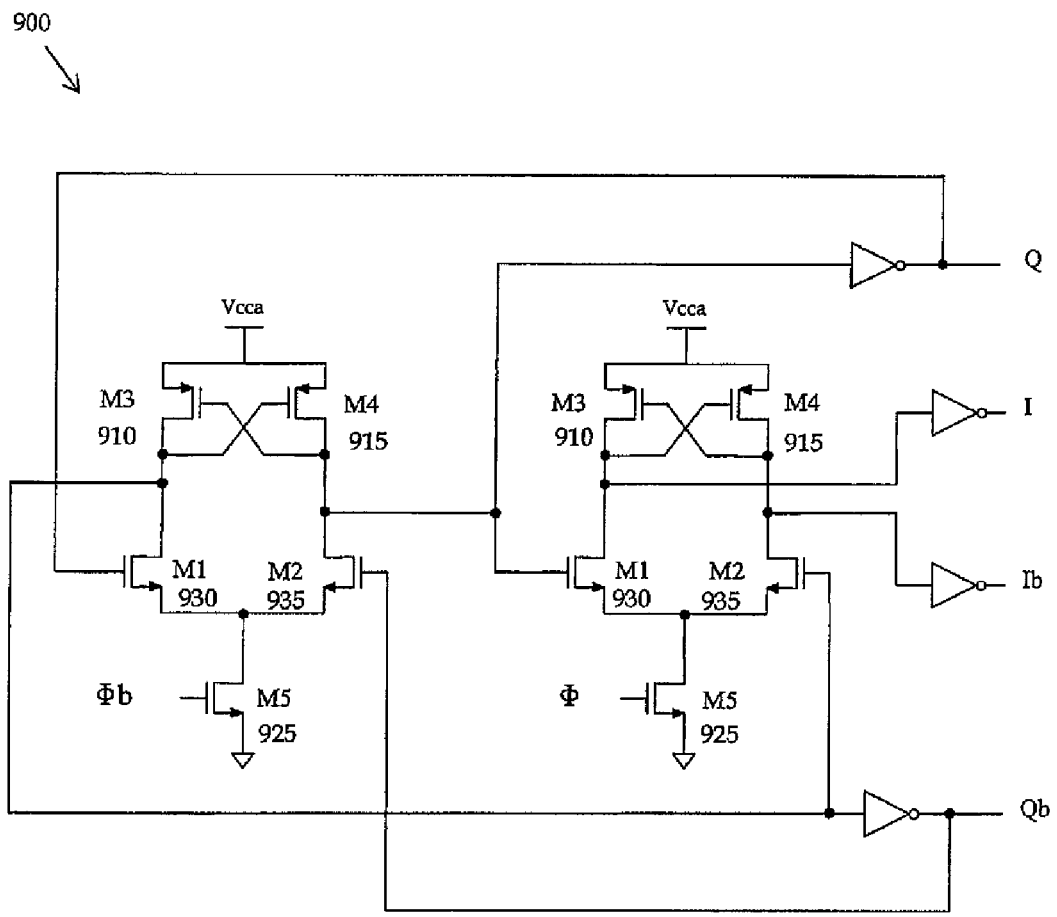
FIG. 9 is a schematic of an example two-stage master-slave flip-flop using two Dynamic-Single-Transistor Clocked (DSTC)n-latches that reduce the number of clocking transistors and does not require bias current transistors.
Figure 10:
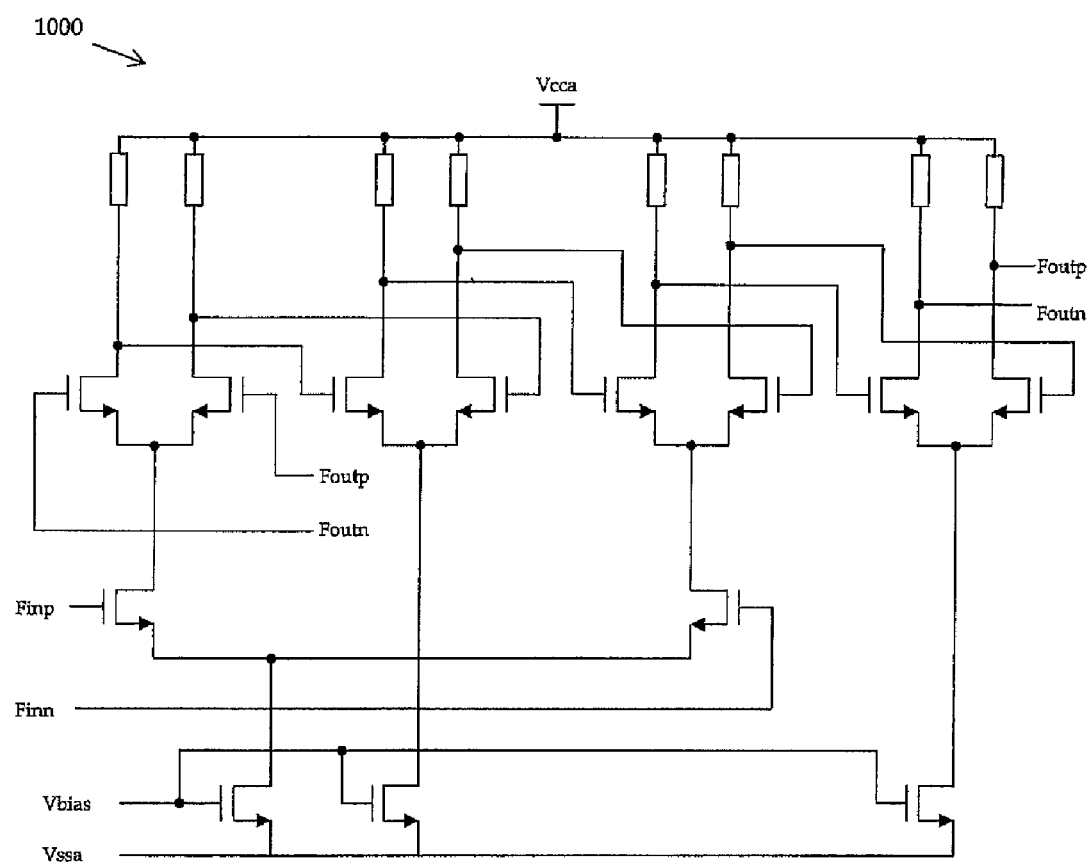
FIG. 10 is a schematic of an example two-stage master-slave flip-flop that does not use latching transistors, but relies on internal nodal capacitance for memory storage.
Figure 11:
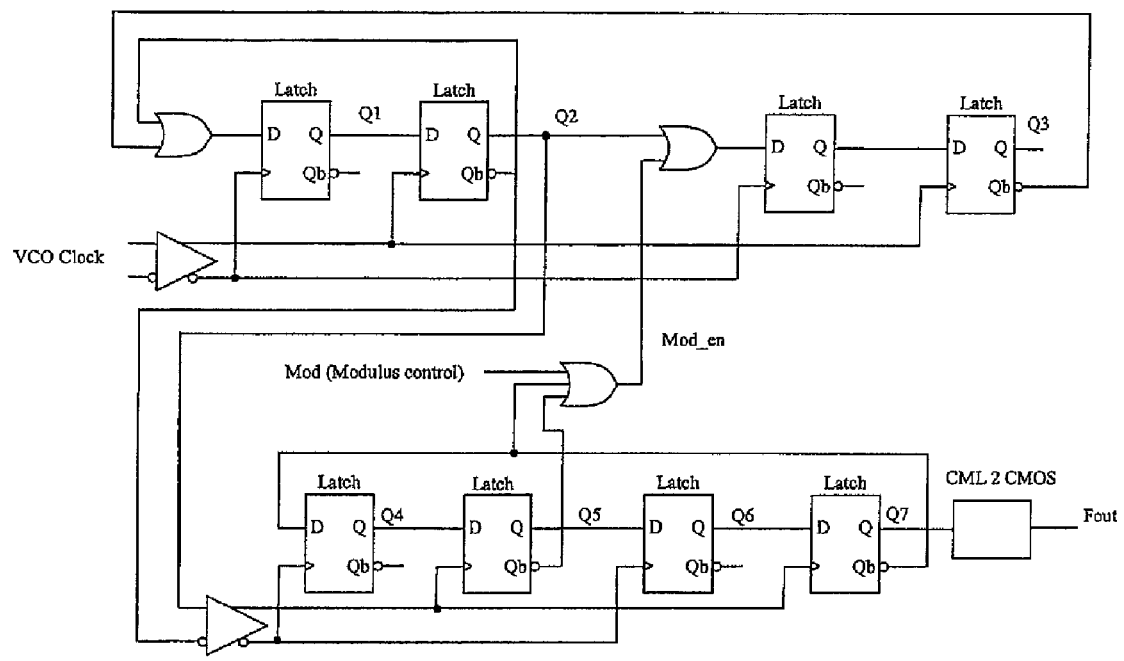
FIG. 11 is an example circuit diagram of a dual modulus prescaler design that can divide an input clock frequency by eight or nine.
Figure 12:
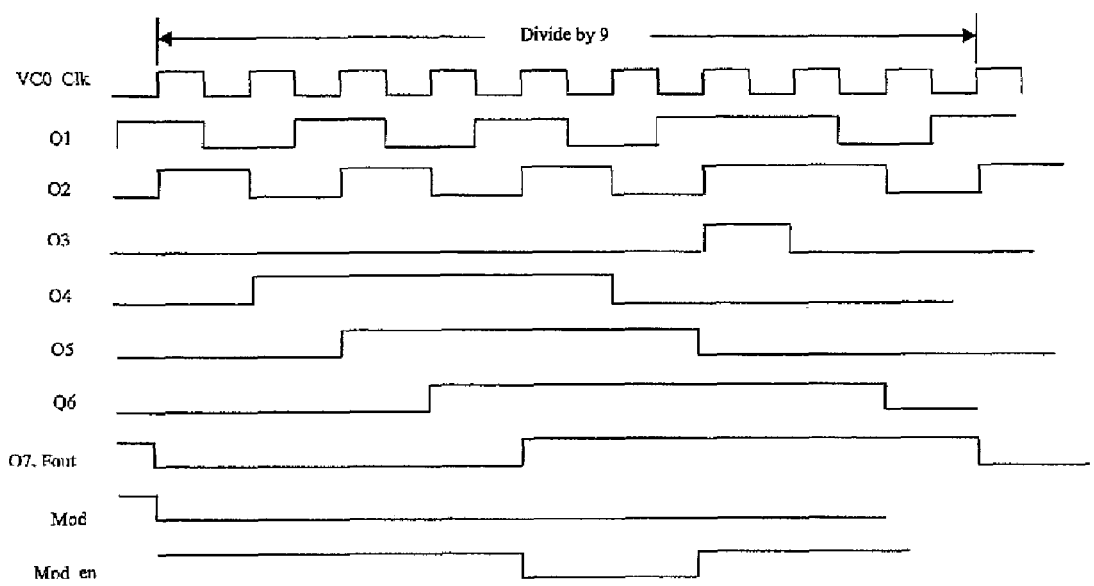
FIG. 12 is an example clock timing diagram of a dual modulus prescaler circuit as in FIG. 10 dividing an input clock frequency by nine.
Figure 13:
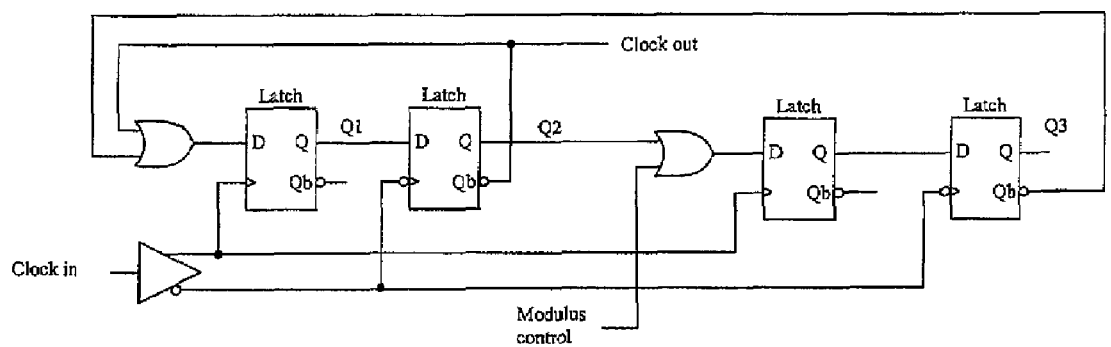
FIG. 13 is an example circuit diagram of a dual modulus prescaler design that can divide an input clock frequency by two or three.
Figure 14:
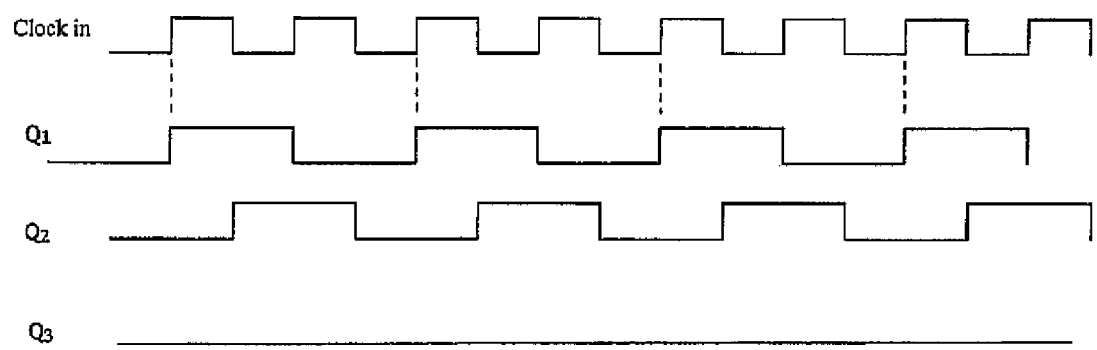
FIG. 14 is an example clock timing diagram of a dual modulus prescaler circuit as in FIG. 12 dividing an input clock frequency by two.
Figure 15:
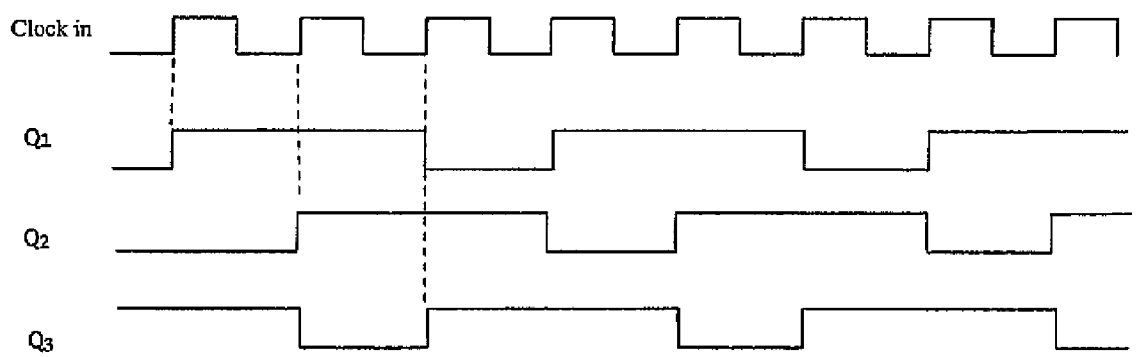
FIG. 15 is an example clock timing diagram of a dual modulus prescaler circuit as in FIG. 12 dividing an input clock frequency by three.
Figure 16:
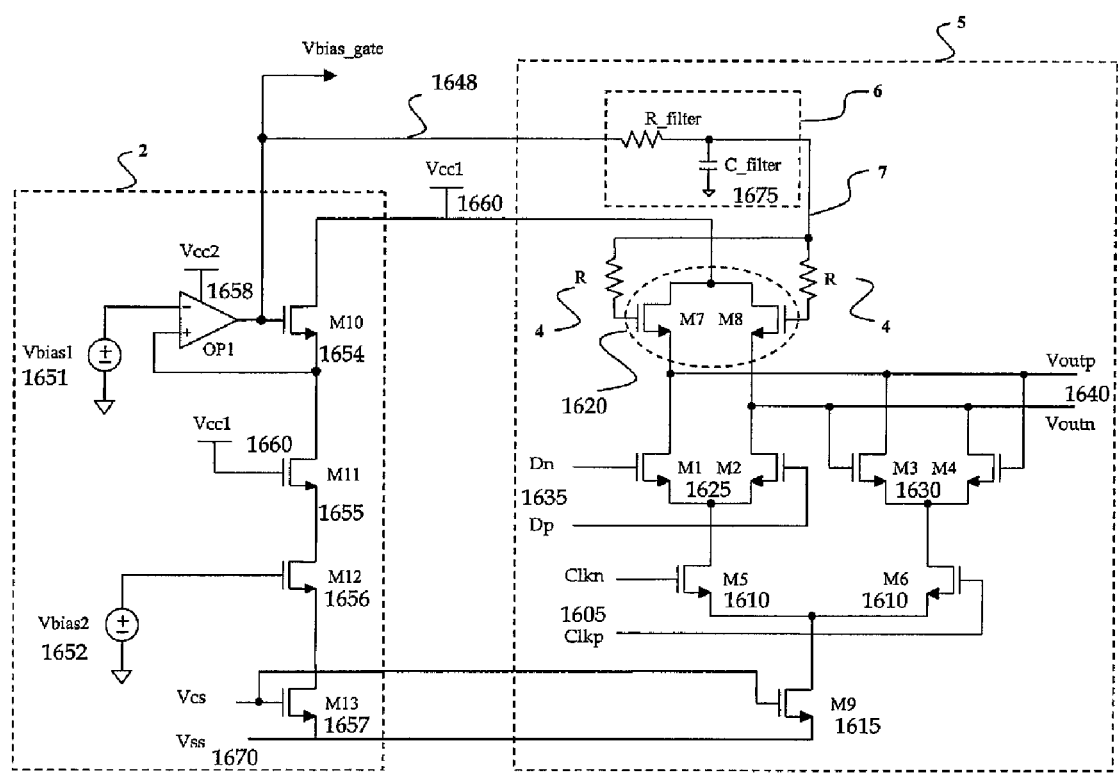
FIG. 16 is an example schematic of a proposed CML latch using shunt-peaked active transistor loads and replica biasing.
Figure 17:
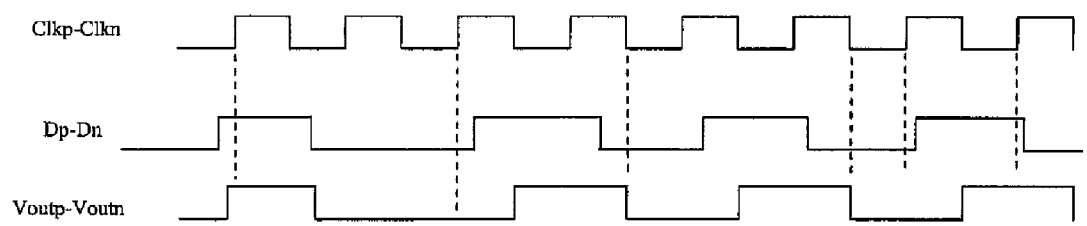
FIG. 17 is an example clock timing diagram of a CML latch using shunt-peaked active transistor loads and replica biasing of FIG. 16, where the latch is defined to sample/latch the input data when the input clock, Clkp-Clkn is negative/positive.

FIG. 16 illustrates an example schematic of a circuit 1600 that has depicts a CML latch 5 that is biased using a replica biasing circuit 2. The CML latch is a two-state circuit that is either used in the data sampling or data latching mode. The differential voltage of the clock input pair Clkp-Clkn determines latch mode of operation. Differential input clocking signals Clkp/Clkn 1605 drive the differential input transistor pair M5/M6 1610. The differential voltage across M5/M6 switches the current required by current source transistor M9 1615. When the voltage of Clkp-Clkn is negative, the latch is in the sampling mode of operation. In the sampling mode, bias current from transistor M9 1615 is flowing through transistor load of M7/M8 1620, differential pair M1/M2 1625 and transistor M5. Based upon the differential input data Dp-Dn 1635, the differential output voltage Voutp-Voutn 1640 is defined. A positive/negative voltage of Dp-Dn 1635 defines a positive/negative voltage of Voutp-Voutn 1640, respectively. When the voltage of Clkp-Clkn is positive, the latch is in the latching mode of operation. In the latching mode of operation, current is supplied through transistor load of M7/M8 1620 and the second stage of the latch consisting of transistor pair M3/M4 1630 and transistor M6 to current source transistor M9 1615. Transistor pair M3/M4 1630 are connected in a cross-coupled configuration. In the latching mode, transistor pair M3/M4 1630 provide positive feedback to latch and retain the voltage at nodes Voutp and Voutn. The voltages at nodes Voutp and Voutn are bi-stable in that their high and low values are controlled to only two levels. The data on differential lines Dp/Dn 1635 are first sampled and then latched. To form a flip-flop, two of these latches are used in series while using opposite input clocking polarities such that one latch stage is in sample/latch mode while the other latch stage is in latch/sample mode.

In the proposed prescaler design, each CML flip-flop latch uses a shunt-peaked loading technique with an NMOS transistor pair M7/M8 1620 which acts as inductive active load elements. The biasing of the gates of transistor pair M7/M8 1620 is important to the ac performance of the CML latch and to how these transistors respond at high switching speeds. The gates of transistors M7/M8 1620 are biased to a voltage (vbias gate 1640) by the replica bias circuitry 2. The replica biasing technique is well understood in the present art but various other circuit design techniques can also be used to bias the gates of M7/M8 1620. The replica bias design depicted here consists of transistors M10 1654, M11 1655, M12 1656 and M13 1657, operational amplifier (OPAMP) OP1 1653 and reference voltages Vbias1 1651 and Vbias2 1652. The replica bias circuitry 2 functions as a low-frequency circuit for the high-speed CML latch 5. The transistor stack in the replica bias block 2 replicates the voltage drop across the active switching transistors M7 or MS in the CML latch. The purpose of the replica bias circuit is to control the voltage at the source of either transistor M7 or MS with a constant current flow. This situation occurs in the data sampling mode with the differential input signal Clkp-Clkn negative and Dp-Dn 1635 either positive or negative. In the data sampling mode, current will be sourced from power supply Vcc1 1660 through either transistor series circuit of M7, M1, M5 and M9 or the transistor series circuit of MS, M2, M5 and M9. Since transistor M9 1615 acts as a current source the value of the total current flow in both data sampling states will be constant.

To ensure proper biasing from the replica bias circuit, the power supply level for Vcc2 1658 must be greater than Vcc1 1660 such that the gate voltages of transistors M7/M8 1620 can exceed the CML latch power supply, Vcc1 1660. The higher gate voltage 7 is needed such that when no current is flowing in either transistor M7 or transistor MS, the source voltage will float up to within a threshold of its own gate voltage. It is desirable to have this off-state voltage reach the power supply of Vcc1 1660 such that power supply headroom within the CML latch is not wasted.

Reference voltage Vbias1 1651 uses conventional circuit techniques well documented to one skilled in the present art. Vbias1 1651 represents the low voltage level that either Voutp or Voutn will approach in active switching. This reference voltage is applied to the negative terminal of OPAMP OP1 1653. Through negative feedback, Vbias1 1651 is also present at the source of transistor M10 1654. Reference voltage Vbias2 1652 represents the common mode plus one half of the differential voltage of clock signals Clkp-Clkn. Thus, when full current is flowing from power supply Vcc1 1660 to ground terminal Vss 1670 through the series circuit replica bias transistors M10 1654, M11 1655, M12 1656 and M13 1657, the voltage at the source of M10 1654 will be equal to Vbias1 1651. The current in transistor chain M10 1654 through M13 1657 tracks the current in the CML latch input stage when the latch is in the data sampling mode. Transistors M13 1657 and M9 1615 are gate-connected and therefore it is preferred to scale down the current in current source transistor M13 1657 to save power in the replica bias circuit. In addition, transistors M11 1655 and M12 1656 can be scaled down relative to transistors M1 and M5, respectively. The voltage in the replica bias circuitry at the gate of transistor M10 1654 is a fixed voltage above its source voltage Vbias1 1651. In the replica bias circuit 2 this node is labelled as Vbias_gate 1648. The reference voltage Vbias_gate 1648 is connected to each individual CML latch in the overall prescaler through an individual input bias filter network 6. Capacitor C_filter 1675 establishes an ac ground potential at the input bias node 7 connected to the two resistors labeled R4.

FIGS. 18a-c show an Analysis of CML latch Active Inductive Load

As shown in FIG. 18(a) and (b)

$$g_m V_{gs} + g_{mb} V_{bs} + i_x = V_x g_{ds} + \frac{V_x}{Z_1}$$

$$i_x = \frac{V_x}{Z_1}$$

$$g_m \frac{-V_x}{sR_1 C_{gs} + 1} + g_{mb}(-V_x) - V_x g_{ds} - \frac{V_x}{Z_1} + i_x = 0$$

$$V_{bs} = -V_s = -V_x$$

$$V_x \left[ \frac{g_m}{sR_1 C_{gs} + 1} + g_{mb} + g_{ds} + \frac{1}{Z_1} \right] = i_x$$

$$V_g = \left[ \frac{R_1}{R_1 + \frac{1}{sC_{gs}}} \right] V_x$$

$$V_x \left[ \frac{sC_{gs} + g_m}{sR_1 C_{gs} + 1} + g_{mb} + g_{ds} \right] = i_x$$

$$V_{gs} = V_g - V_x$$

$$V_x \left[ \frac{sC_{gs} + g_m + (g_{mb} + g_{ds})(sR_1 C_{gs} + 1)}{sR_1 C_{gs} + 1} \right] = i_x$$

$$V_{gs} = \left[ \frac{R_1}{R_1 + \frac{1}{sC_{gs}}} - 1 \right] V_x$$

$$Z_o = \frac{V_x}{i_x} = \left[ \frac{(sR_1 C_{gs} + 1)}{sC_{gs}(1 + (g_{mb} + g_{ds})R_1) + (g_m + g_{mb} + g_{ds})} \right]$$

$$V_{gs} = \frac{-1}{(sR_1 C_{gs} + 1)} V_x$$

$$Z_o = \frac{1}{(g_m + g_{mb} + g_{ds})} \left[ \frac{(sR_1 C_{gs} + 1)}{\frac{sC_{gs}(1 + (g_{mb} + g_{ds})R_1)}{(g_m + g_{mb} + g_{ds})} + 1} \right]$$

At low frequencies:

$$Z_o |_{\omega=0} = \frac{1}{(g_m + g_{mb} + g_{ds})}$$

At high frequencies:

$$Z_o |_{\omega=\infty} = \frac{1}{(g_m + g_{mb} + g_{ds})} \left[ \frac{R_1 C_{gs}}{\frac{C_{gs}(1 + (g_{mb} + g_{ds})R_1)}{(g_m + g_{mb} + g_{ds})}} \right] = \frac{R_1}{1 + (g_{mb} + g_{ds})R_1} \approx R_1$$

For large bias currents:

$$\frac{1}{(g_m + g_{mb} + g_{ds})} < R_1$$

Construct model for $Z_o(\omega)$ as shown in FIG. 18(c):

$$Z_a |_{\omega=0} = r_1 // r_2 = \frac{r_1 r_2}{r_1 + r_2} \quad Z_a |_{\omega=\infty} = r_2$$

Assume:

$$Z_a |_{\omega=\infty} << Z_a |_{\omega=0} \rightarrow r_2 >> r_1$$

$$Z_a = \frac{(r_1 + sL)r_2}{r_1 + r_2 + sL} = \frac{r_1 r_2}{r_1 + r_2} \frac{\frac{sL}{r_1} + 1}{\frac{sL}{r_1 + r_2} + 1}$$

Equate $Z_a$ to $Z_o$ $$\frac{L}{r_1} = R_1 C_{gs}$$

$$\frac{L}{r_1 + r_2} = \frac{C_{gs}(1 + (g_{mb} + g_{ds})R_1)}{g_m + g_{mb} + g_{ds}}$$

$$\frac{L}{r_1 + r_2} \approx \frac{L}{r_2} = \frac{C_{gs}(1 + (g_{mb} + g_{ds})R_1)}{g_m + g_{mb} + g_{ds}}$$

$$Z_o = \frac{(r_1 + sL)r_2}{r_1 + r_2 + sL} = \frac{r_1 r_2}{r_1 + r_2} \frac{\frac{sL}{r_1} + 1}{\frac{sL}{r_1 + r_2} + 1}$$

$$\frac{r_1 r_2}{r_1 + r_2} \approx r_1 = \frac{1}{g_m + g_{mb} + g_{ds}}$$

$$r_1 \approx \frac{1}{g_m}$$

$$\frac{L}{r_1} = R_1 C_{gs}$$

$$L = \frac{R_1 C_{gs}}{g_m + g_{mb} + g_{ds}} \approx \frac{R_1 C_{gs}}{g_m}$$

$$r_2 =$$

$$\frac{L(g_m + g_{mb} + g_{ds})}{C_{gs}(1 + (g_{mb} + g_{ds})R_1)} = \frac{R_1 C_{gs}}{C_{gs}(g_m + g_{mb} + g_{ds})} \frac{(g_m + g_{mb} + g_{ds})}{C_{gs}(1 + (g_{mb} + g_{ds})R_1)}$$

-continued $$r_2 = \frac{R_1}{1+(g_{mb}+g_{ds})R_1} = R_1$$

The above analysis is significant since the benefits of a shunted peaked amplifier will apply here. The active load transistor can now be optimized for maximum bandwidth response characteristics. The required shunt impedance modeling values, L, $r_1$ and $r_2$, can be determined for the appropriate theoretical response. Then, based upon the small signal modeling equations defined above, the thick gate transistor's ($M_3$, $M_4$) W/L ratio geometry can be specified for the proper $g_m$ as well as resistor $R_1$. Thus, the amplifier design using an active load can be optimized for the appropriate response given the driving point load impedance just as is done in the shunt-peaked amplifier analysis using spiral inductors.

Figure 18:
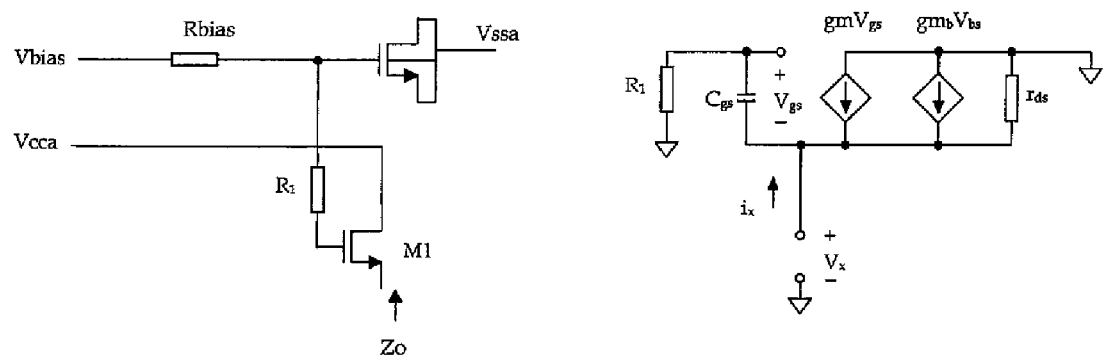
FIG. 18 is an example of a small-signal model and analysis of an active inductive load element useful in CML latches for high frequency dividers.
Figure 18:
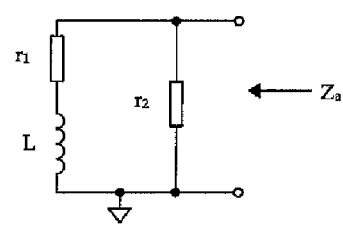

As demonstrated in FIG. 18 and applied to FIG. 16, resistors R connected to the gates of shunt-peaking transistors M7 and M8 partially influence the amount of inductive impedance that the CML latch sees looking into the source of transistor M7 and M8. Controlling this inductance in the CML active load to the proper value will tune out the driving load capacitance that the latch must drive. To control the inductive impedance accurately is a major goal of the CML latch since an optimized design will translate to a higher bandwidth circuit that can accommodate higher input clock frequencies and higher input data rates. Higher bandwidth will be achieved with the decreased setup and hold times of the latch. In addition, with the driving load capacitance partially cancelled by the inductive component, the switching current of the latch circuit is reduced when operating at a specific clocking and sampling frequency.

To summarize, as demonstrated in FIG. 18, and the accompanying small-signal ac analysis, the small signal output impedance looking into the source of transistor M7 and M8 appear inductive. Active inductor tunes out the driving load capacitance and achieves a higher bandwidth. The required monolithic die area for this type of active load is minimized and requires no additional power dissipation.

The invention claimed is:

1. A prescaler circuit comprising:
   a latch comprising:
   a first clocked differential pair comprising input terminals coupled to a data input of the latch, a first output terminal coupled to a first output of the latch, and a second output terminal coupled to a second output of the latch;
   a second clocked differential pair with a first input terminal coupled to the second output of the latch, a second input terminal coupled to the first output of the latch; a first output terminal coupled to the first output of the latch, and a second output terminal coupled to the second output of the latch;
   a first shunt peaked active load circuit coupled to the first output of the latch;
   a second shunt peaked active load circuit connected to the second output of the latch;
   a replica bias circuit to control a voltage of the shunt peaked active loads, wherein the replica bias circuit comprises a transistor stack to replicate a voltage drop across the shunt peaked active loads of the latch, wherein the shunt peaked active loads comprise a resistor and a transistor; and wherein the replica bias circuit is configured to generate a voltage at the resistors that is higher than a supply voltage of the latch; and a filter network coupled between the replica bias circuit and the resistors.

2. The prescaler circuit of claim 1, wherein the filter network comprises a filter capacitor to establish an AC ground potential at a node coupled to the resistors, wherein the filter capacitor comprises a gate capacitance of a transistor with a source terminal and drain terminal connected together.

3. The prescaler circuit of claim 2 wherein the filter network further comprises a bias resistor that is coupled between the replica bias circuit and the resistors of the shunt peaked active loads.

4. The prescaler circuit of claim 3, wherein a response speed of the shunt peaked active load circuits is a factor of the voltage controlled with the replica bias circuit.

5. The prescaler circuit of claim 4, wherein the bias resistor is coupled to a gate of the transistor that comprises the gate capacitance.

6. The prescaler circuit of claim 5, wherein the replica bias circuit comprises a feedback amplifier that compensates for process and temperature variations, and wherein the voltage controlled with the replica bias circuit is coupled to the output of the feedback amplifier.

7. The prescaler circuit of claim 5, wherein one transistor in the transistor stack is biased at a common mode voltage of the latch plus one half of a differential voltage of latch clocks.

8. The prescaler circuit of claim 1, wherein the latch is configured as a differential amplifier circuit.

9. The prescaler circuit of claim 1, wherein the latch is configured as used in a divider circuit.

10. The prescaler circuit at of claim 1, wherein the latch is configured to be implemented in semiconductor technologies comprising CMOS, bipolar, BiCMOS, SiGe, and GaAs technologies.

11. A prescaler circuit comprising:
    a latch with an active load configured for shunt-peaked amplification, wherein the active load comprises shunt-peaking elements configured to have an inductive impedance that at least partially cancel a capacitive load impedance of the latch, the latch further comprising resistors coupled to the shunt-peaking elements;
    a replica bias circuit configured to control a voltage of the shunt-peaking elements, wherein the replica bias circuit comprises a transistor stack to replicate a voltage drop across the shunt-peaking elements of the latch, and wherein the replica bias circuit is configured to generate a voltage at the resistors that is higher than a supply voltage of the latch; and
    a filter network coupled between the replica bias circuit and the resistors.

12. The prescaler circuit of claim 11, wherein the shunt-peaking elements comprise inductorless elements.

13. The prescaler circuit of claim 11, wherein the latch comprises a current-mode logic (CML) latch, and wherein a replica bias circuit current is a scaled version of a latch current.

14. The prescaler circuit of claim 11, wherein the latch comprises two flip flips.

15. The prescaler circuit of claim 11, wherein the active load comprises transistors, wherein a gain of the latch is a function of a ratio of transconductances of the transistors.

16. The prescaler circuit of claim 15, wherein the transistors comprise gate widths and lengths that are scaled for the transistors to serve as inductive active load elements.

17. The prescaler circuit of claim 16, wherein source nodes of the transistors are configured to have a voltage controlled with the voltage generated from the replica bias circuit.

18. The prescaler circuit of claim 16, wherein the transistors comprises shunt impedance values that approximate a spiral inductor impedance.

19. A method to improve a bandwidth of a latch, the method comprising:
   generating an inductive impedance in the latch with inductorless loads in the latch, wherein the inductorless loads comprise resistors and transistors as shunt-peaking elements, and wherein the transistors have a port that appears as the inductive impedance;
   tuning a frequency of the latch by using the inductive impedance of the inductorless loads to at least partially cancel a capacitive load impedance of the latch;
   adjusting a timing requirement of the latch with the tuned frequency to provide the improvement of the bandwidth;
   biasing the inductorless loads with a replica bias circuit voltage comprising a voltage that is higher than a supply voltage of the latch; and
   filtering the replica bias circuit voltage with a filtering network coupled to the inductorless loads.

20. The method of claim 19, wherein the latch is a current-mode logic (CML) latch.

21. The method of claim 19, further comprising employing the latch as a prescaler for a divider circuit.

22. The method of claim 21, further comprising setting a gain of the divider circuit as a function of a ratio of tranconductances of the transistors.

23. The method of claim 19, wherein the adjustment of the timing requirement comprises adjusting a setup time requirement or a hold time requirement of the latch.

24. The method of claim 19, further comprising clocking the latch at a clocking frequency that is a function of the frequency tuning of the latch.

25. A prescaler circuit comprising:
   at least two latches coupled together to form a flip flop circuit such that when a first latch is in a first mode, a second latch is in an opposite mode, wherein the first mode is either a sample mode or a hold mode;
   a pair of transistors in at least one of the latches to form a shunt-peaked load in the latch, the pair of transistors being configured to form an inductive impedance to partially cancel a capacitive load impedance of the latch;
   a bias circuit to generate a bias voltage for the pair of transistors; and
   a filter network coupled between the bias circuit and the pair of transistors to filter the bias voltage.

26. The prescaler circuit of claim 25, wherein the at least one latch comprises:
   a clocking differential input pair of transistors configured to receive a differential input clock signal;
   a differential input pair of transistors configured to receive a differential input data signal, the second differential input pair of transistors being coupled to a first transistor in the clocking differential input pair of transistors, the second differential input pair of transistors further being coupled to the pair of transistors that form the shunt-peaked loading; and
   a differential output pair of transistors configured for a differential output signal, the differential output pair of transistors being coupled to a second transistor in the clocking differential input pair of transistors, the differential output pair of transistors being coupled to the pair of transistors that form the shunt-peaked loading, the differential output pair of transistors further being crossed-coupled to the differential input pair of transistors.

27. The prescaler circuit of claim 25, wherein the at least one latch comprises a current-mode logic (CML) latch, and wherein the bias circuit comprises a transistor stack that is configured to replicate a voltage drop across the pair of transistors in the latch.

28. The prescaler circuit of claim 25, wherein the bias circuit is configured for lower speed operation than the at least one latch, and wherein the filter network comprises a capacitor to establish an AC ground potential for the pair of transistors.

29. The prescaler circuit of claim 25, wherein the inductive impedance in the at least one latch at least partially cancels out a capacitance load impedance of the at least one latch.

30. The prescaler circuit of claim 29, wherein the at least one latch is configured to reduce an amount of a switching current when the inductive impedance at least partially cancels out the capacitance load impedance.

31. The prescaler circuit of claim 30, wherein an impedance at sources of the pair of transistors in the at least one latch comprises the inductive impedance in the latch.

* * * * *

UNITED STATES PATENT AND TRADEMARK OFFICE
CERTIFICATE OF CORRECTION

PATENT NO. : 7,521,976 B1  
APPLICATION NO. : 11/296549  
DATED : April 21, 2009  
INVENTOR(S) : Douglas Sudjian It is certified that error appears in the above-identified patent and that said Letters Patent is hereby corrected as shown below:

Title Page, Col. 2, (Other Publications), please delete "Floipflops" and insert therefore --Flipflops--.

Column 12, line 8, Claim 3, please delete "2" and insert therefore --2,--.

Column 12, line 20, Claim 10, please delete "at of" and insert therefore --of--.

Column 13, lines 26-27, please delete "tranconductances" and insert therefore --transconductances--.

Signed and Sealed this

Sixteenth Day of June, 2009

JOHN DOLL  
*Acting Director of the United States Patent and Trademark Office*

UNITED STATES PATENT AND TRADEMARK OFFICE
CERTIFICATE OF CORRECTION

PATENT NO.        : 7,521,976 B1                           Page 1 of 1
APPLICATION NO.   : 11/296549
DATED             : April 21, 2009
INVENTOR(S)       : Sudjian et al.

It is certified that error appears in the above-identified patent and that said Letters Patent is hereby corrected as shown below:

On the cover page, should read as follows:

Item [*] Notice:    Subject to any disclaimer, the term of this patent is extended or adjusted under 35 USC 154(b) by (264) days Delete the phrase "by 264 days" and insert -- by 144 days --

Signed and Sealed this

Third Day of November, 2009

David J. Kappos
*Director of the United States Patent and Trademark Office*